(12) United States Patent
Ko et al.

(10) Patent No.: US 9,954,505 B2
(45) Date of Patent: Apr. 24, 2018

(54) AUDIO OUTPUT CONTROL METHOD AND ELECTRONIC DEVICE SUPPORTING THE SAME

(71) Applicant: Samsung Electronics Co., Ltd., Gyeonggi-do (KR)

(72) Inventors: Han Ho Ko, Gyeonggi-do (KR); Je Heon Park, Gyeonggi-do (KR); Nam-Il Lee, Gyeonggi-do (KR); Sang Phil Hong, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 114 days.

(21) Appl. No.: 14/595,777

(22) Filed: Jan. 13, 2015

(65) Prior Publication Data

US 2015/0200638 A1    Jul. 16, 2015

(30) Foreign Application Priority Data

Jan. 13, 2014 (KR) .................. 10-2014-0003813

(51) Int. Cl.
*H04R 29/00* (2006.01)
*H03G 3/30* (2006.01)

(52) U.S. Cl.
CPC .................. *H03G 3/3005* (2013.01)

(58) Field of Classification Search
CPC .................. H03G 3/3005; G10L 19/00
USPC ....... 381/15, 58, 59, 103, 104, 106, 109, 55, 381/56, 94.1, 96, 98, 102, 107, 108, 120, 381/111, 117; 704/500
See application file for complete search history.

(56) References Cited

U.S. PATENT DOCUMENTS

| | | |
|---|---|---|
| 5,898,340 A | 4/1999 | Chatterjee et al. |
| 6,229,389 B1 | 5/2001 | Pullen et al. |
| 6,653,899 B2 | 11/2003 | Organvidez et al. |
| 6,724,254 B2 | 4/2004 | Lin |
| 6,785,521 B2 | 8/2004 | Hadjichristos et al. |
| 6,812,715 B2 | 11/2004 | Chiozzi et al. |
| 6,816,009 B2 | 11/2004 | Hughes et al. |
| 6,940,703 B1 | 9/2005 | Kemp et al. |
| 7,053,705 B2 | 5/2006 | Hench et al. |
| 7,113,603 B1 | 9/2006 | Cahill |
| 7,259,618 B2 | 8/2007 | Hand et al. |
| 7,489,489 B2 | 2/2009 | Kim |
| 7,672,463 B2 | 3/2010 | Park et al. |
| 7,839,616 B2 | 11/2010 | Kim |
| 8,023,668 B2 | 9/2011 | Pfaffinger |
| RE43,461 E | 6/2012 | Hand et al. |
| 8,259,961 B2 | 9/2012 | Okumura |
| 8,274,772 B2 | 9/2012 | Skov et al. |
| 8,310,225 B2 | 11/2012 | Michalak |

(Continued)

OTHER PUBLICATIONS

Korean Office Action dated Sep. 8, 2017 issued in counterpart application No. 10-2014-0003813, 14 pages.

*Primary Examiner* — Paul S Kim
*Assistant Examiner* — Friedrich W Fahnert
(74) *Attorney, Agent, or Firm* — The Farrell Law Firm, P.C.

(57) ABSTRACT

Disclosed is an audio output control method and an electronic device supporting the same. The audio output control method includes determining an output of an audio processing unit decoding an audio source signal, and controlling generating of a reference signal to be supplied to an audio output unit in response to an output of the audio processing unit.

18 Claims, 5 Drawing Sheets

(56) References Cited

U.S. PATENT DOCUMENTS

| | | |
|---|---|---|
| 8,538,039 B2 | 9/2013 | Pfaffinger |
| 8,548,804 B2 | 10/2013 | Barrett et al. |
| 8,761,409 B2 * | 6/2014 | Pfaffinger ............ H04R 29/001 |
| | | 381/103 |
| 9,008,322 B2 | 4/2015 | Botti et al. |
| 2002/0011899 A1 | 1/2002 | Organvidez et al. |
| 2002/0057804 A1 * | 5/2002 | Mellott ................ H03G 3/3026 |
| | | 381/15 |
| 2002/0085725 A1 * | 7/2002 | Bizjak .................. H03G 3/3089 |
| | | 381/106 |
| 2002/0093340 A1 | 7/2002 | Chiozzi et al. |
| 2002/0137480 A1 | 9/2002 | Hadjichristos et al. |
| 2002/0180525 A1 | 12/2002 | Lin |
| 2003/0122549 A1 | 7/2003 | Chiozzi et al. |
| 2004/0012440 A1 | 1/2004 | Hughes et al. |
| 2005/0094342 A1 | 5/2005 | Kim |
| 2005/0111669 A1 | 5/2005 | Park et al. |
| 2005/0134374 A1 | 6/2005 | Hench et al. |
| 2006/0161424 A1 | 7/2006 | Tzeng |
| 2007/0057720 A1 | 3/2007 | Hand et al. |
| 2007/0160221 A1 | 7/2007 | Pfaffinger |
| 2008/0106249 A1 * | 5/2008 | Barrett .................... G10L 25/69 |
| | | 324/76.38 |
| 2009/0028349 A1 * | 1/2009 | Park ..................... H04R 29/001 |
| | | 381/59 |
| 2009/0121703 A1 | 5/2009 | Kirn |
| 2009/0122997 A1 * | 5/2009 | Okumura ................. H03G 3/32 |
| | | 381/58 |
| 2010/0157498 A1 | 6/2010 | Skov et al. |
| 2010/0166226 A1 * | 7/2010 | Kikkawa ................ H04S 3/008 |
| | | 381/109 |
| 2010/0176793 A1 | 7/2010 | Michalak |
| 2011/0085678 A1 | 4/2011 | Pfaffinger |
| 2011/0087341 A1 | 4/2011 | Pfaffinger |
| 2012/0308050 A1 | 12/2012 | Botti et al. |
| 2013/0141829 A1 | 6/2013 | Skov et al. |
| 2013/0251164 A1 | 9/2013 | Gautama |
| 2013/0259266 A1 * | 10/2013 | Yayama .................. H03F 3/181 |
| | | 381/120 |
| 2014/0169571 A1 * | 6/2014 | Polleros ................. H04R 3/007 |
| | | 381/55 |

* cited by examiner

AUDIO OUTPUT CONTROL METHOD AND ELECTRONIC DEVICE SUPPORTING THE SAME

PRIORITY

This application claims priority under 35 U.S.C. § 119 to Korean Patent Application No. 10-2014-0003813 filed in the Korean Intellectual Property Office on Jan. 13, 2014, the contents of which are incorporated herein by reference.

BACKGROUND OF THE INVENTION

1. Field of the Invention

The present invention generally relates to audio output.

2. Description of the Related Art

The use of mobile electronic devices has become widespread due in large part to the small size of such devices. Many conventional electronic devices support an audio source reproduction function for playing an audio source that is selected in response to an audio source reproduction request.

However, the conventional electronic device outputs an audio signal that includes noise due to various factors while the played audio source is output. Accordingly, there is a need in the art for an audio source reproduction function for playing an audio source while eliminating the factors creating noise in the conventional electronic device.

SUMMARY OF THE INVENTION

The present invention has been made to address the above problems and disadvantages occurring in the prior art, and to provide at least the advantages set forth below.

Accordingly, an aspect of the present invention is to provide an audio output control method capable of providing improved audio output environments by removing noise generated upon outputting an audio signal and an electronic device supporting the audio output control method.

In accordance with an embodiment of the present invention, an electronic device that supports audio output control includes a memory, and a controller (or control module) that operates the memory, wherein the control module controls at least one of generating a reference signal to be supplied to an audio output unit and supplying the reference signal to the audio output unit based on an output value of an audio processing unit.

In accordance with another embodiment of the present invention, an audio output control method includes determining an output of an audio processing unit decoding an audio source signal, and controlling generation of a reference signal to be supplied to an audio output unit in response to an output of the audio processing unit.

BRIEF DESCRIPTION OF THE DRAWINGS

The above aspects, features and advantages of the present invention will be more apparent from the following detailed description taken in conjunction with the accompanying drawings, in which.

DETAILED DESCRIPTION OF EMBODIMENTS OF THE INVENTION

Embodiments of the present invention will be described in detail with reference to the accompanying drawings. In the drawings, the same or similar elements are denoted by the same reference numerals even though they are depicted in different drawings. In the following description, a detailed description of known functions and configurations incorporated herein will be omitted for the sake of clarity and conciseness.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Electronic devices according to embodiments of the present invention includes the following devices each having an Application Processor (AP), a Graphics Processing Unit (GPU), or a Central Processing Unit (CPU): all information communication devices supporting a function to be described with reference to various embodiments of the present invention, a multimedia device, or an application device thereof. For example, an electronic device according to embodiments of the present invention includes a mobile terminal, a tablet PC, a smart phone, a digital camera, a Portable Multimedia Player (PMP), a media player, a portable game console, and a Personal Digital Assistant (PDA).

The electronic device according to embodiments of the present invention includes various types of electronic devices each including an audio processing module with an audio output function. For example, the various types of electronic devices include an electronic watch, an electronic bracelet, an electronic anklet, an electronic necklace, an electronic earring, an electronic ring, and an electronic belt. In various embodiments, the electronic device may be implemented in the form of at least one of a suit or pants that may be defined to have an audio output function. The electronic device may be an electronic device, which is placed at a specific power supply module, as well as a wearable electronic device. For example, the electronic device may be a vehicle that supports an audio processing function.

Figure 1:
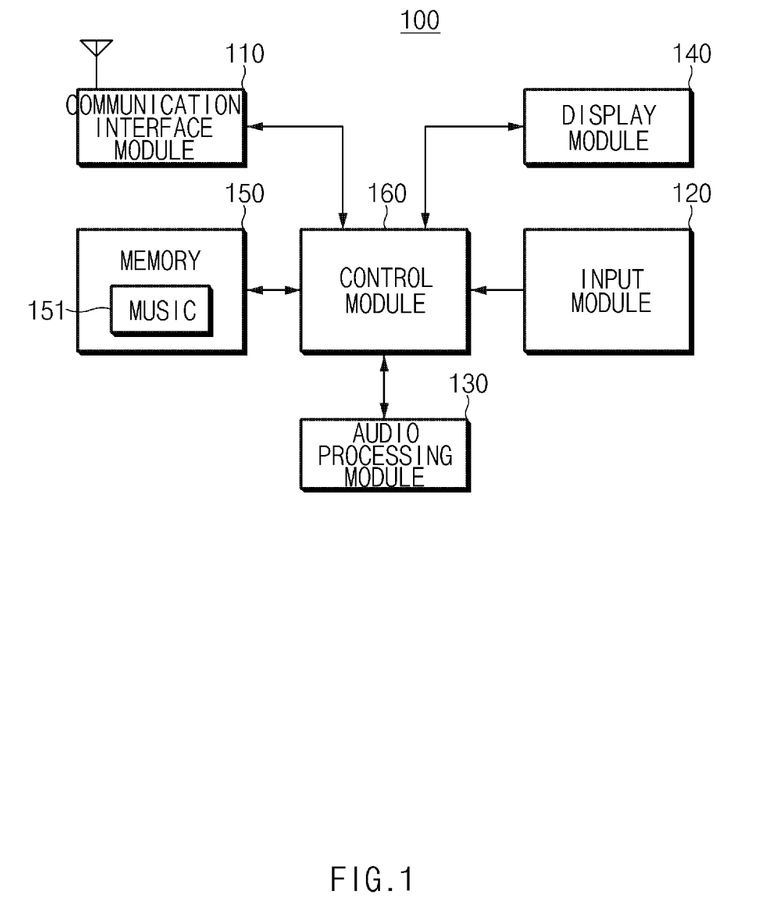
FIG. 1 illustrates an electronic device according to an embodiment of the present invention.

FIG. 1 illustrates an electronic device according to an embodiment of the present invention.

Referring to FIG. 1, an electronic device 100 according to an embodiment of the present invention comprises a communication interface module 110, an input module 120, an audio processing module 130, a display module 140, a memory 150, and a control module (or, controller, processor) 160.

The electronic device 100 determines an audio output state of the audio processing module 130 and controls an audio output module associated with removal of noise depending on the audio output state. For example, based on the audio output state, the electronic device 100 selectively enables a generation of a reference signal for protecting an audio output unit (for example, speaker (not shown)) included with the audio processing module 130. Thus, the electronic device 100 provides an improved audio output environment as the electronic device 100 suppresses noise when the reference signal is applied. Also, the electronic device 100 optimizes the supply of power needed to perform at least one of a reference signal-generating operation or a reference signal applying operation, thereby reducing power.

The communication interface module 110 may be included when the electronic device 100 has a communication function, and may be excluded from the electronic device 100 when the electronic device 100 does not support the communication function. The communication interface module 110 may be a communication interface module that forms a channel for communications with any other electronic device or a server device, or may be a communication interface module that supports a function of receiving broadcasting. The communication interface module 110 receives audio data through a communication channel. The audio data that the communication interface module 110 received is stored at the memory 150. Alternatively, the communication interface module 110 transmits the received audio data to the control module 160 (or controller), and output the audio data through the audio processing module 130 under a control of the control module 160. The electronic device 100 performs an audio output control operation associated with noise reduction while the audio data that the communication interface module 110 receives is output through the audio processing module 130.

For example, the communication interface module 110 receives a server page from a server device and transfers the received server page to the display module 140. The communication interface module 110 transmits a specific music reproduction request included in the server page to the server device. The communication interface module 110 receives specific audio data from a corresponding server device and sends the specific audio data to the control module 160. During this process, the electronic device 100 performs the audio output control operation associated with removal of noise. In embodiments of the present invention, the electronic device 100 may not perform a generation of the reference signal to be supplied to the audio output unit (for example, the speaker) before an audio source request message is transmitted. The electronic device 100 performs a reference signal-generating operation and a speaker-protecting operation when the music reproduction request message is sent and audio data is received. The speaker-protecting operation may be based on generation of the reference signal.

The input module 120 performs an operation associated with generation of an input signal of the electronic device 100. The input module 120 includes various key buttons and a key pad, for example. The key buttons include at least a side key, a home key, and a power key. The input module 120 may be implemented in the form of a touch key, for example. The display module 140 operates as the input module 120 when the display module 140 is implemented in the form of touch screen. In response to user inputs, the input module 120 generates an input signal associated with activation of a player for playing music, an input signal for selecting music 151 stored at the memory 150, an input signal for requesting reception of audio data from any other electronic device or an external server device, and an input signal for requesting an audio source reproduction end. The input module 120 also generates an input signal for requesting application of a function (hereinafter audio output control function) of controlling an audio output and an input signal for requesting release of the audio output control function being applied. Omitted is an operation of generating the input signal for requesting the application of the audio output control function of the input module 120 when the electronic device 100 is designed to automatically provide the audio output control function.

The audio processing module 130 supports audio output of the electronic device 100. The audio processing module 130 includes audio processing modules and a speaker, for example. The audio processing module 130 may further include a microphone when an electronic device supports a function of collecting an audio signal. For example, at a required state that controls audio information output, the audio processing module 130 generates the reference signal and conducts a speaker-protecting operation. The required state includes when an audio signal of which the magnitude is greater than or equal to a specific magnitude is output. At a non-required state that controls audio information output, the audio processing module 130 may not perform generation of the reference signal and may not conduct the speaker-protecting operation. The non-required state includes at least one of a silent state and when an audio signal of which the magnitude is less than or equal to a specific magnitude is output. An audio signal processing operation and a control operation of the audio processing module 130 will be more fully described with reference to FIG. 3.

The display module 140 outputs various screens associated with the use of the electronic device 100. For example, the display module 140 outputs an idle screen or home screen, a menu screen, a screen including at least one icon and a lock screen. The display module 140 also outputs a screen associated with an audio source reproduction request. For example, the display module 140 outputs a screen including menu items or icons associated with audio source reproduction and a screen including an icon for connection with a server device. In addition, the display module 140 outputs at least the following: a screen including a list of audio source 151 stored at the memory 150, a screen for activating a player that may reproduce the audio source 151 stored at the memory 150, a screen for playing the audio source 151 stored at the memory 150, and a screen for playing audio data that the communication interface module 110 receives.

The display module 140 outputs information for guiding application of the audio output control function, such as a speaker-protecting function by the generation and application of the reference signal. When the reference signal is generated and the speaker-protecting function is not applied, the display module 140 outputs information for guiding an audio output unit (for example, a speaker) non-protection state. The display module 140 outputs information or an indicator indicating whether to apply the audio output control function with regard to noise reduction. The memory 150 stores a program associated with the use of the electronic device 100 and data. For example, the memory 150 stores an Operating System (OS) of the electronic device 100, as well as a web browser program, a program for supporting a broadcasting receiving function, a camera program, and a program associated with a game, for supporting specific functions of the electronic device 100.

The memory 150 according to an embodiment of the present invention also stores at least one audio source 151 which is received from any other electronic device or a web server device through the communication interface module 110. The audio source 151 is created using various functions of the electronic device 100. The memory 150 stores a player program associated with reproduction of the audio source 151. A player may be automatically executed when specific audio source 151 is selected, or may be executed when execution of a player is requested. The electronic device 100 provides icons or menu items through the display module 140 with regard to the execution of the player.

The control module 160 performs transferring and processing on data and control signals associated with the use of the electronic device 100. The control module 160 according to an embodiment of the present invention applies the audio output control function by the use of the audio processing module 130. The control module 160 includes components shown in FIG. 2 with reference to the audio output control function.

Figure 2:
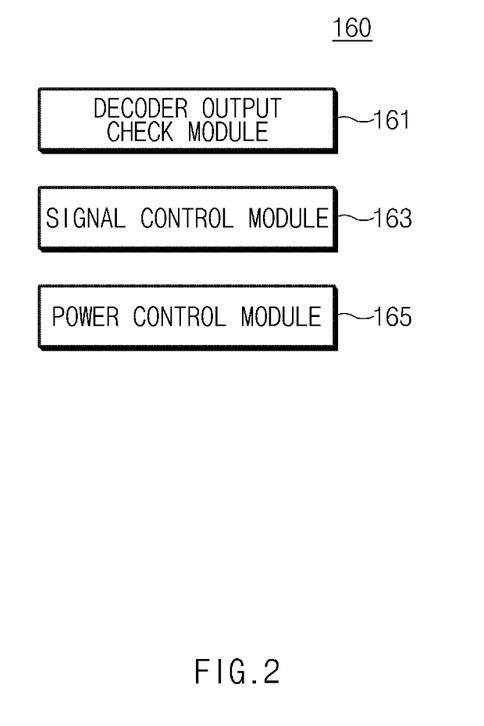
FIG. 2 illustrates a control module according to an embodiment of the present invention.

FIG. 2 illustrates a control module according to an embodiment of the present invention.

Referring to FIG. 2, a control module 160 includes a decoder output check module 161, a signal control module 163, and a power control module 165.

The decoder output check module 161 determines an output state of an audio processing unit (for example, a decoder) that an audio processing module 130 includes. For example, the decoder output check module 161 detects a signal from an output port (or, output terminal). The decoder output check module 161 determines whether application of an audio output control function associated with noise reduction is valid or invalid, based on the detected signal. In embodiments of the present invention, the decoder output check module 161 determines whether the audio processing unit (for example, the decoder) is at a non-required state that controls audio information output, which state may correspond to a silent state where a signal is not separately output or to a state where there is output of a signal having a magnitude less than or equal to a specific magnitude or a signal having a frequency band other than a specific frequency band. The specific frequency band may be an audible frequency band. The decoder output check module 161 further determines whether the decoder is at a required state that controls audio information output, which state may correspond to output of a signal having a magnitude greater than or equal to a specific magnitude, or a signal of an audible frequency band.

The decoder output check module 161 provides the signal control module 163 with first information in accordance with the required state for controlling audio information output or second information in accordance with the non-required state for controlling audio information output, based on the determined result of the decoder output state. The decoder output check module 161 transmits the first information or the second information to the power control module 165. In embodiments of the present invention, the first information or the second information may be used in the form of a specific message. Alternatively, the first information or the second information output may be implemented with a specific bit value of "1" or "0" that is defined for communications between the decoder output check module 161 and either the signal control module 163 or the power control module 165.

The signal control module 163 controls whether to generate a reference signal, based on a decoder output result from the decoder output check module 161. For example, the signal control module 163 receives the second information from the decoder output check module 161, where the second information corresponds to a state where the decoder output result indicates a silent state or to a state where an output value is less than or equal to a specific value. When receiving the second information, the signal control module 163 may not perform a reference signal generation. When receiving the first information from the decoder output check module 161, the signal control module 163 enables the reference signal to be generated.

The power control module 165 receives the first information or the second information from the decoder output check module 161. When receiving the first information, the power control module 165 supplies power to at least one of a module that generates a reference signal, a module that performs a speaker-protecting operation in response to the reference signal, and a module associated with processing of an audio signal. When receiving the second information, the power control module 165 may stop supplying power to at least one of the module that generates the reference signal, the module that performs the speaker-protecting operation in response to the reference signal, and the module associated with processing of the audio signal.

Figure 3:
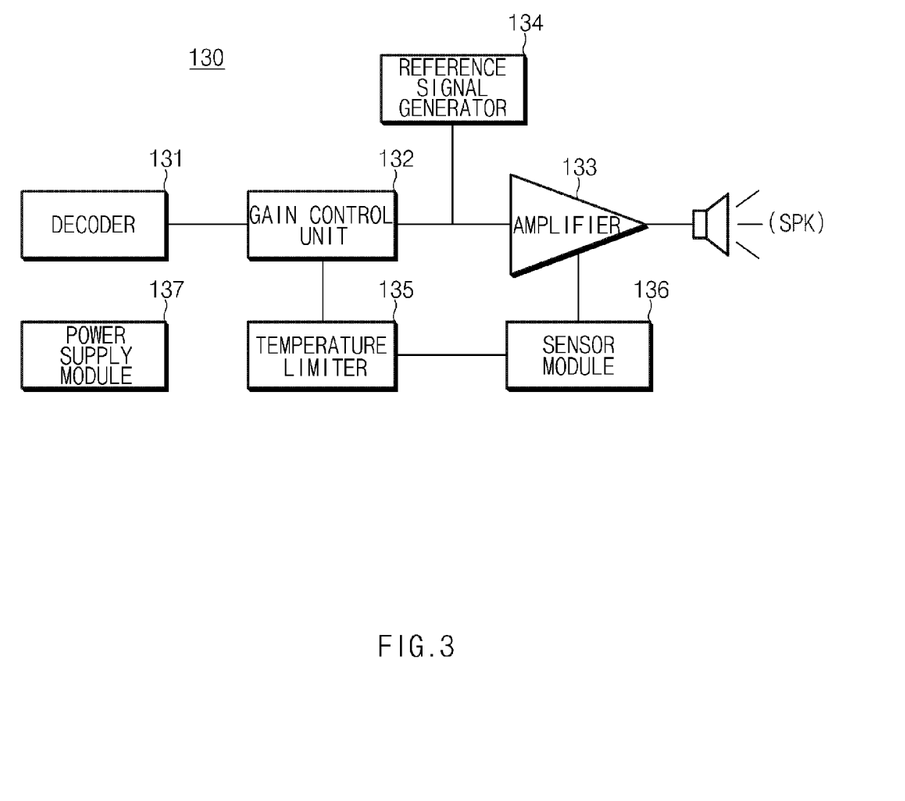
FIG. 3 illustrates components associated with audio processing according to an embodiment of the present invention.

FIG. 3 illustrates components associated with audio processing according to an embodiment of the present invention.

Referring to FIG. 3, an audio processing module 130 includes an audio processing unit (for example, a decoder) 131, a gain control unit 132, an amplifier 133, a reference signal generator 134, a temperature limiter 135, a sensor module 136, a power supply module 137, and a speaker SPK.

The decoder 131 decodes audio data that a communication interface module 110 receives or the audio source 151 stored at the memory 150. For example, the decoder 131 decodes audio data compressed according to a specific compression manner to convert the audio data into specific digital information. The decoder 131 may act as a Digital-to-Analog Converter (DAC) that converts the decoded digital information into an analog signal. For example, an analog signal received from the decoder 131 may be a format-converted signal of specific audio source or a decoding signal of audio source. The decoder 131 provides the analog signal to the gain control unit 132. An output signal of the decoder 131 is fed back to the decoder output check module 161 of the control module 160. The decoder output check module 161 detects an output signal of the decoder 131 that has a magnitude greater than or equal to a specific magnitude or belongs to an audible frequency band, as the first information in accordance with a required state that controls audio information output. The decoder output check module 161 detects a silent state of the decoder 131 or an output signal of the decoder 131 that has a magnitude less than or equal to a specified value, as the second information in accordance with a non-required state for controlling audio information output.

The gain control unit 132 adjusts gain of an analog signal from the decoder 131 and a parameter associated with the gain. The gain control unit 132 also adjusts gain, corresponding to information that the temperature limiter 135 provides, and a parameter associated with the gain. For example, the gain control unit 132 determines a state of the speaker SPK, based on an impedance value and a temperature value that the temperature limiter 135 provides. When it is determined that the impedance value and the temperature value are greater than or equal to a specified value and, therefore, are damaging to the speaker SPK, the gain control unit 132 adjusts the gain and the parameter associated with the gain such that the speaker SPK is not damaged.

The gain and the gain-associated parameter values that do and do not cause damage to the speaker SPK vary depending on the hardware characteristic of the speaker SPK and a characteristic of the amplifier 133. Thus, an adjustment range of the gain and the gain-associated parameter may be defined experimentally or differently depending on hardware characteristics of modules included in the audio processing module 130. The gain control unit 132 operates using power supplied by the power supply module 137. The power to be supplied to the gain control unit 132 may be blocked when an output value of the decoder 131 indicates the second information. The power is supplied to the gain control unit 132 when the output value of the decoder 131 indicates the first information.

The amplifier 133 amplifies an analog signal, based on at least one of a specific volume level or gain control from the gain control unit 132. The analog signal amplified by the amplifier 133 is sent to the speaker SPK. The amplifier 133 operates using power from the power supply module 137. Supplying of power to the amplifier 133 is interrupted when the output value of the decoder 131 indicates the second information. Power is supplied to the amplifier 133 when the output value of the decoder 131 indicates the first information.

The reference signal generator 134 generates a pilot signal, for example, to protect the speaker SPK. The reference signal generator 134 sends a generated reference signal to the speaker SPK. The generated reference signal is used to sense at least one of a voltage or a current of the speaker SPK. The reference signal generator 134 operates using power from the power supply module 137. Supply of power to the reference signal generator 134 is interrupted when the output value of the decoder 131 indicates the non-required state that controls audio information output, and is provided when the output value of the decoder 131 indicates the required state for controlling audio information output.

The sensor module 136 detects at least one of a voltage or a current of a signal that is used in the speaker SPK. The sensor module 136 includes an Analog-to-Digital Converter (ADC) that converts an analog signal detected from the speaker SPK into a digital signal. The sensor module 136 provides the temperature limiter 135 with at least one of a voltage signal or a current signal that is obtained by a voltage distribution of the reference signal.

Supply of power to the sensor module 136 is selectively blocked depending on the output signal of the decoder 131, such as when the output value of the decoder 131 corresponds to the second information in accordance with the non-required state for controlling audio information output. Power is supplied to the sensor module 136 when the output value of the decoder 131 corresponds to the first information.

The temperature limiter 135 estimates the impedance and temperature values of the speaker SPK, based on sensing information of at least one of a voltage signal or a current signal sent by the sensor module 136. The temperature limiter 135 provides the gain control unit 132 with the detected impedance and temperature values. Supply of power to the temperature limiter 135 is selectively blocked depending on an output value of the decoder 131. For example, the power supply module 137 supplies power to the temperature limiter 135 when the output value of the decoder 131 indicates the first information, and blocks the supply of power to the temperature limiter 135 when the output value of the decoder 131 indicates the second information.

The power supply module 137 supplies power to at least one of the decoder 131, the gain control unit 132, the amplifier 133, the reference signal generator 134, the sensor module 136, and the temperature limiter 135 of the audio processing module 130.

The power supply module 137 supplies or blocks power in response to control of the power control module 165 of the control module 160. For example, the power supply module 137 supplies power to the decoder 131 when an audio source reproduction request is received or activation of a player associated with audio source reproduction is requested. When the output value of the decoder 131 corresponds to the first information, the power supply module 137 maintains supply of power to the gain control unit 132, the amplifier 133, the reference signal generator 134, the sensor module 136, and the temperature limiter 135 in response to control of the power control module 165.

When the output value of the decoder 131 corresponds to the second information, the power supply module 137 blocks power to be supplied to at least one of the gain control unit 132, the amplifier 133, the reference signal generator 134, the sensor module 136, and the temperature limiter 135 in response to control of the power control module 165. A power supplying and blocking function of the power supply module 137 is adjusted according to a designer's choice. For example, at an audio source reproduction request, the power supply module 137 supplies the power to at least one of the gain control unit 132 and the amplifier 133 regardless of an output state of the decoder 131. The power supply module 137 performs power control on the reference signal generator 134, the sensor module 136, and the temperature limiter 135 associated with an audio output unit (for example, a speaker) protection function, based on an output of the decoder 131 and a control of the power control module 165.

The speaker SPK outputs the amplified analog audio source signal from the amplifier 133. The speaker SPK includes a portion of a signal line that is connected with the ADC of the sensor module 136.

The scope of the present invention is not limited to the audio processing module 130 of the electronic device 100 including the decoder 131, the gain control unit 132, the amplifier 133, the reference signal generator 134, the sensor module 136, and the temperature limiter 135. For example, the control module 160 of the electronic device 100 may include the decoder 131, and the electronic device 100 may be implemented such that the DAC is separately disposed, and not included in the decoder 131. Additionally or alternatively, the power supply module 137 may be separately disposed, and not included in the audio processing module 130.

In embodiments of the present invention, the control module 160 enables the reference signal to be generated when the decoder 131 outputs a signal of which the magnitude is greater than or equal to a specific magnitude. The signal of which the magnitude is greater than or equal to the specific magnitude may be of an audible frequency band.

In embodiments of the present invention, the control module 160 may not perform the reference signal generation when an output of the decoder 131 corresponds to a silent state or has a magnitude less than or equal to a specific magnitude.

When an output of the decoder 131 corresponds to a silent state or has a magnitude less than or equal to a specific magnitude, the control module 160 controls the power supply module 137 such that power to be supplied to the reference signal generator 134, the sensor module 136, and the temperature limiter 135 is blocked.

Figure 5:
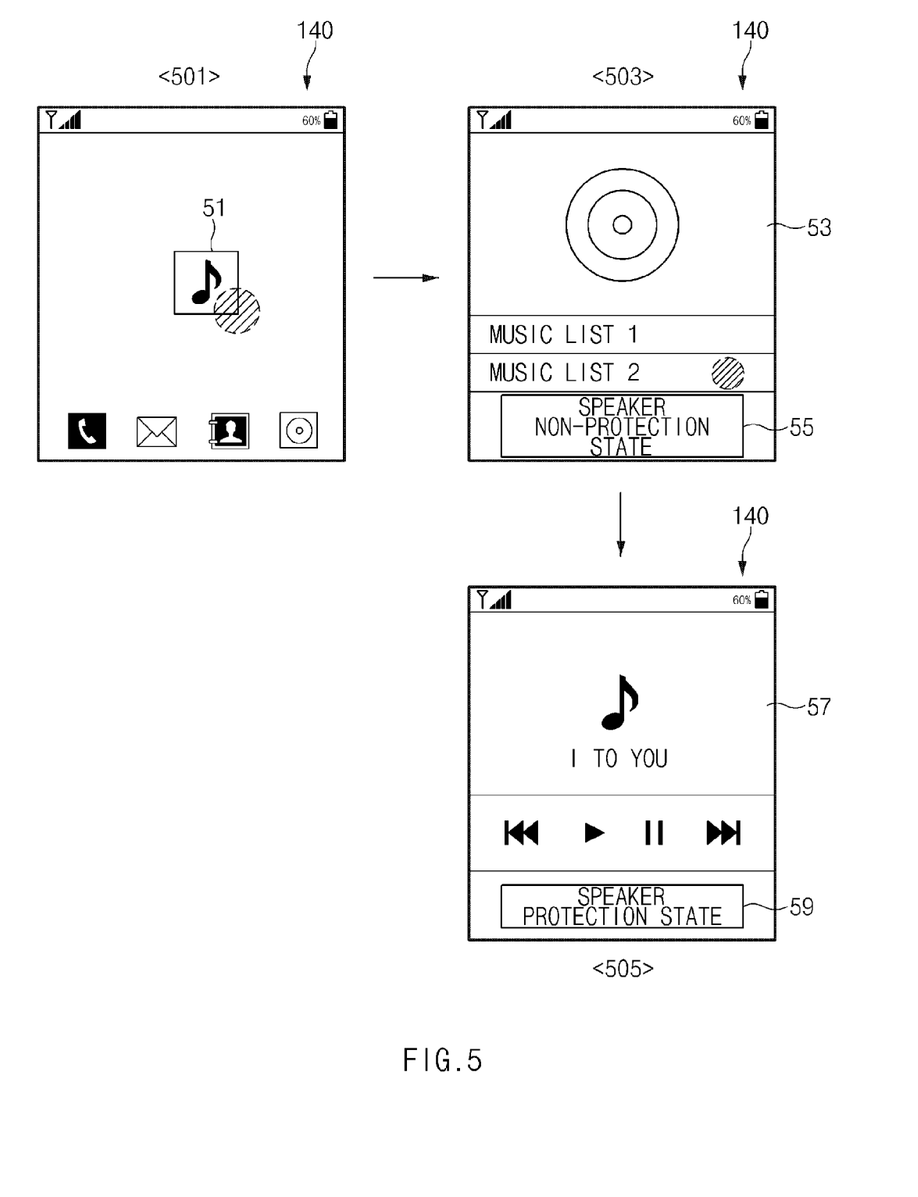
FIG. 5 illustrates a screen interface associated with audio output control according to an embodiment of the present invention.

The electronic device 100 may further include a display module 140, illustrated in FIG. 5, that displays whether to apply a speaker protection function in accordance with generation of the reference signal. The display module 140 outputs information on a speaker protection state when the reference signal is generated and used. The display module 140 outputs information on a speaker non-protection state when generation of the reference signal is not performed.

Figure 4:
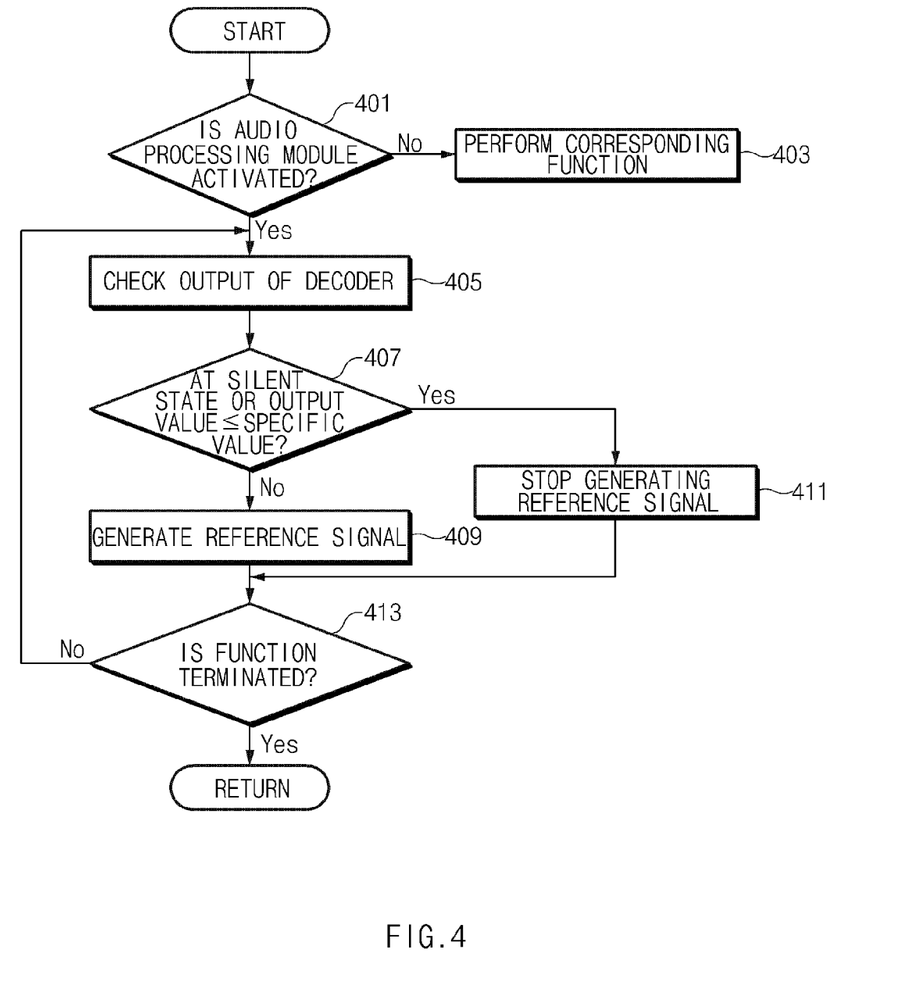
FIG. 4 illustrates an audio output control method according to an embodiment of the present invention.

FIG. 4 illustrates an audio output control method according to an embodiment of the present invention.

Referring to FIG. 4, when a specific event associated with audio output control is issued, in step 401, a control module 160 determines whether the specific event is for activating an audio processing module 130, and consequently, whether to activate the audio processing module 130. The electronic device 100 outputs at least one of icons or menu items associated with audio source reproduction through a display module 140. Alternatively, the electronic device 100 assigns a specific key button to a hot key for activating a player associated with the audio source reproduction. As a consequence of determining that the specific event is not for activating the audio processing module 130, in step 403, the control module 160 enables a function corresponding to the specific event to be performed. For example, the control module 160 enables a web connection function, a file searching function, or a camera function corresponding to the specific event to be performed.

When the specific event issued in step 401 is for activating the audio processing module 130, for example, an event for selecting the above-described icons or menu items or a key button, the control module 160 activates at least one of the decoder 131, the gain control unit 132, the amplifier 133, the reference signal generator 134, the sensor module 135, and the temperature limiter 136 included in the audio processing module 130. In step 405, the control module 160 detects the output of the decoder 131.

When the output of the decoder 131 is detected, in step 407, the control module 160 determines whether an output value of the decoder 131 corresponds to the second information. The second information may correspond to a silent state or to a state where the output value is less than or equal to a specific value.

When the output value of the decoder 131 corresponds to the first information, the method proceeds to step 409, in which generation of a reference signal is supported. The first information corresponds to a state where an audio signal is output and has a magnitude greater than or equal to a specific magnitude, and is a signal of an audible frequency band, for example. The reference signal may be a pilot signal that is used to detect at least one of a voltage signal or a current signal of the speaker SPK.

The sensor module 136 of the audio processing module 130 detects at least one of the voltage signal or the current signal of the speaker SPK depending on an input of the reference signal. The temperature limiter 135 detects an impedance value and a temperature value of the speaker SPK in response to the detected voltage or current signal and transfers the detected result to the gain control module 132, which determines whether the speaker SPK leaves an operating range causing no damage, based on the impedance value and the temperature value.

When at least one of a specific impedance value or a specific temperature value damaging the speaker SPK is detected, the gain control unit 132 adjusts at least one of gain or a parameter associated with the gain. An adjustment range varies with a physical characteristic of the speaker SPK and of the amplifier 133. Accordingly, the audio processing module 130 performs a function of protecting the speaker SPK using the reference signal.

When an output value of the decoder 131 is the second information, in step 411, the control module 160 does not enable generation of the reference signal. At this time, the control module 160 controls the power supply module 137 such that the power to be supplied to the reference signal generator 134 is blocked. The power to be supplied to modules associated with the function of protecting the speaker SPK is also blocked in response to a control of the control module 160. The power to be supplied to at least one of the sensing unit 136 for sensing a voltage signal or a current signal of the speaker SPK, the temperature limiter 135, the amplifier 133, and the gain control unit 132 is also blocked, under a control of the control module 160.

In step 413, the control module 160 determines whether an event associated with a function of the audio output control is terminated. In this process, when no event associated with the function termination is issued, the method returns to step 405, in which steps 405, 407, 409, and 411 are again performed under a control of the control module 160. If the event associated with the function termination is issued, the control module 160 terminates the audio source reproduction function. The control module 160 then returns to a specified function state, for example, a home screen or a standby screen state, or to a function screen performed just before audio source reproduction.

In addition, the audio output control method may further include includes determining an output of a decoder 131 that decodes an audio source signal and controlling whether to generate a reference signal to be supplied to a speaker SPK in response to an output value of the decoder 131. The reference signal may be a pilot signal that is used to protect the speaker SPK.

The audio output control method may further include generating the reference signal when the decoder 131 outputs a signal of which the magnitude is greater than or equal to a specific magnitude, or not generating the reference signal when the decoder 131 outputs a signal that corresponds to a silent state or a signal of which the magnitude is less than or equal to a specific magnitude. The signal may be of an audible frequency band.

Not generating the reference signal includes blocking a power to be supplied to a reference signal generator 134 that generates the reference signal.

The method may further include sensing at least one of a voltage signal or a current signal of the speaker SPK, detecting at least one of an impedance value or a temperature value of the speaker SPK, based on at least one of the detected voltage signal or current signal, and adjusting gain of the decoded signal, based on at least one of the impedance value or the temperature value.

The method may further include at least one of blocking a power needed for the sensing when the decoder 131 outputs a signal that corresponds to a silent state or a signal of which the magnitude is less than or equal to a specific magnitude, and blocking a power needed for the detecting or controlling.

In exemplary embodiments, the method further may include outputting whether to apply a function of protecting the speaker SPK depending on whether to the reference signal is generated. The outputting includes information on a speaker protection state depending on generation and application of the reference signal and outputting information on a speaker non-protection state when the generation of the reference signal is not performed.

FIG. 5 illustrates a screen interface associated with audio output control according to an embodiment of the present invention.

Referring to FIG. 5, a display module 140 outputs an icon 51 associated with an audio output function as displayed on screen 501. The icon 51 may be replaced with a menu item or with a specific key button. When an event associated with an audio output control function, for example, a touch event associated with selection of the icon 51 on screen 501 is issued, the display module 140 outputs a screen associated with the audio output function as displayed on screen 503.

Specifically, in screen 503 the display module 140 outputs a player activation screen which includes an audio source list area 53 and a first speaker-associated area 55. The audio source list area 53 includes various items including an item for selecting at least one of audio source 151 stored at a memory 150 and an item for selecting audio data provided by an external server device or any other electronic device. The audio source list area 53 includes information associated with corresponding audio source 151, for example, a screen for guiding the memory 150 or information associated with any other type of electronic device or server device.

The first speaker-associated area 55 indicates whether a function of protecting a speaker SPK is applied. When a speaker non-protection state is displayed on the first speaker-associated area 55, a reference signal generator 134 is at an inactive state. In this case, the decoder 131 outputs a signal that corresponds to a silent state or a signal of which the magnitude is less than or equal to a specified value. Power to be supplied to at least one of a gain control unit 132, an amplifier 133, a sensor module 136, and a temperature limiter 135 is interrupted. When the reference signal generator 134 is at an inactive state, an electronic device 100 interrupts supplying of a reference signal that is automatically provided to protect the speaker SPK. Thus, when an audio signal is not separately output, the electronic device 100 prevents the reference signal from being output through the speaker SPK as noise.

When specific audio source is selected at a player activation screen state, the display module 140 outputs an audio source reproduction screen as displayed on screen 505. The audio source reproduction screen includes an audio source information area 57 and a second speaker-associated area 59. The audio source information area 57 includes information associated with the specific audio source selected on screen 503, for example, audio source title information, audio source reproduction time information, and audio source tag information. The second speaker-associated area 59 includes a speaker protection state in accordance with audio source reproduction. In the speaker protection state, a reference signal generator 134 of an audio processing module 130 generates a reference signal and transfers the reference signal to the speaker SPK.

The sensor module 136 senses variations in voltage and current that are generated when the speaker SPK processes the reference signal. The temperature limiter 135 determines an impedance value and a temperature value of the speaker SPK, based on at least one of the voltage signal or the current signal and provides the determined result to the gain control unit 132, which compares the currently checked impedance and temperature values of the speaker SPK with specific state values of the speaker SPK and determines whether to control gain to protect the speaker SPK.

As described above, an audio output control method and an electronic device supporting the same determines whether to generate a reference signal to be supplied to a speaker SPK, based on an output value of a decoder 131. Thus, noise generated by the reference signal is removed. Also, the use of power is optimized by restricting the unnecessary use of the power to be supplied to at least one of audio processing modules that operate to stop generating a reference signal and to protect the speaker SPK.

The audio output control method and the electronic device supporting the same control such that a reference signal that the reference signal generator 134 generates is not transferred to the speaker SPK, such that noise is reduced by interrupting a reference signal to be supplied to the speaker SPK. For this, the electronic device 100 includes a switch disposed between the reference signal generator 134 and the speaker SPK.

When an output state of a decoder 131, for example, an output of the decoder 131 corresponds to a non-required state that controls audio information output, the electronic device 100 controls a switch operation such that the reference signal generated by the reference signal generator 134 is not transferred to the speaker SPK. In this case, the power supply module 137 continues to supply the power to the reference signal generator 134 at an audio source reproduction request regardless of an output state of the decoder 131.

As described above, the audio output control method and the electronic device supporting the same prevent noise from being generated at the audio output environment, thereby improving the audio output environment.

Also, power management is improved by optimizing supplying of power to a device component causing noise.

While the present invention has been described with reference to certain embodiments, it will be apparent to those skilled in the art that various changes and modifications is created without departing from the spirit and scope of the present invention. Therefore, it should be understood that the above embodiments are not limiting, but illustrative.

What is claimed is:

1. An electronic device which controls an audio output, the electronic device comprising:
   an audio output unit;
   an audio processing unit; and
   a controller configured to:
   obtain decoded audio data through the audio processing unit, and
   when a frequency of the decoded audio data is included in a specific frequency band, control the audio output unit to generate and output a reference audio signal which is used to sense at least one of a voltage and a current of a speaker; or
   when the frequency of the decoded audio data is not included in the specific frequency band, control the audio output unit not to generate the reference audio signal.

2. The electronic device of claim 1, wherein the controller is further configured to control the audio output unit to output the reference audio signal by controlling to generate the reference audio signal or by controlling to provide the generated reference audio signal.

3. The electronic device of claim 1, wherein the audio output unit outputs the reference audio signal when the decoded audio data is included in an audible frequency band.

4. The electronic device of claim 1, further comprising:
   a sensor module that detects at least one of a voltage signal and a current signal of the audio output unit;
   a temperature limiter that detects at least one of an impedance value and a temperature value, based on at least one of the detected voltage signal and the current signal;
   a gain control unit that performs a gain control on a decoded signal, based on at least one of the impedance value or the temperature value; and
   a power supply module that supplies power to at least one of the sensor module, the temperature limiter, the gain control unit, and a reference signal generator.

5. The electronic device of claim 4, wherein when the audio processing unit outputs a signal corresponding to a silent state or having a magnitude less than or equal to a specific magnitude, the controller is further configured to control the power supply module to interrupt the power to be supplied to at least one of the reference signal generator, the sensor module, and the temperature limiter.

6. The electronic device of claim 1, further comprising a display module that displays information indicating whether to apply a audio output unit protection function in accordance with a generation of the reference audio signal,
   wherein the controller is further configured to control the display module to display information corresponding to an audio output unit protection state when generating and using the reference audio signal.

7. The electronic device of claim 1, further comprising a power supply module that supplies a power to a reference signal generator which generates the reference audio signal,
   wherein when the audio processing unit outputs a signal corresponding to a silent state or having a magnitude less than or equal to a specific magnitude, the controller is further configured to control the power supply module to interrupt the supply of the power to the reference signal generator.

8. The electronic device of claim 1, further comprising a display module that displays information indicating whether to apply an audio output unit protection function in accordance with a generation of the reference audio signal,
   wherein the controller is further configured to control to display information corresponding to an audio output unit non-protection state when a generation of the reference audio signal is not performed.

9. An audio output control method, comprising:
   obtaining decoded audio data of an audio processing unit decoding an audio source signal; and
   when a frequency of the decoded audio data is included in a specific frequency band, controlling the audio output unit to generate and output a reference audio signal which is used to sense at least one of a voltage and a current of a speaker; or
   when the frequency of the decoded audio data is not included in the specific frequency band, controlling the audio output unit not to generate the reference audio signal.

10. The audio output control method of claim 9, wherein the reference audio signal is a pilot signal used to protect the audio output unit.

11. The audio output control method of claim 9, wherein controlling generation of the reference audio signal comprises:
   generating the reference audio signal when the audio processing unit outputs a signal having a magnitude greater than or equal to a specific magnitude, or
   refraining from generating the reference audio signal when the audio processing unit outputs a signal corresponding to a silent state or having a magnitude less than or equal to a specific magnitude.

12. The audio output control method of claim 11, wherein the signal is of an audible frequency band.

13. The audio output control method of claim 11, wherein refraining from generating the reference audio signal comprises:
   interrupting power to be supplied to a reference signal generator that generates the reference audio signal.

14. The audio output control method of claim 9, further comprising:
   sensing at least one of a voltage signal and a current signal of the audio output unit;
   detecting at least one of an impedance value and a temperature value, based on at least one of the detected voltage signal and current signal; and
   performing a gain control on a decoded signal, based on at least one of the impedance value and the temperature value.

15. The audio output control method of claim 14, further comprising at least one of:
    interrupting power needed for sensing when the audio processing unit outputs a signal corresponding to a silent state or has a magnitude less than or equal to a specific magnitude,
    interrupting a power needed for detecting, and
    interrupting a power needed for performing the gain control.

16. The audio output control method of claim 9, further comprising:
    outputting, on a display module, information indicating whether to apply an audio output unit protection function in accordance with a generation of the reference audio signal.

17. The audio output control method of claim 16, wherein outputting the information indicating whether to apply the audio output unit protection function comprises at least one of:
    outputting, on the display module, information on an audio output unit protection state depending on a generation and a use of the reference audio signal; and
    outputting, on the display module, information on an audio output unit non-protection state when a generation of the reference audio signal is not performed.

18. A non-transitory computer-readable recording medium having recorded thereon at least one instruction to be executed by a processor for an audio output control method, the method comprising:
    obtaining decoded audio data of an audio processing unit decoding an audio source signal; and
    when a frequency of the decoded audio data is included in a specific frequency band, controlling the audio output unit to generate and output a reference audio signal which is used to sense at least one of a voltage and a current of a speaker; or
    when the frequency of the decoded audio data is not included in the specific frequency band, controlling the audio output unit not to generate the reference audio signal.

* * * * *